United States Patent [19]

Ruegg

[11] 4,266,267
[45] May 5, 1981

[54] MOUNTING ARRANGEMENT FOR TRANSISTORS AND THE LIKE

[75] Inventor: Eugen H. Ruegg, Forest, Va.

[73] Assignee: General Electric Company, Lynchburg, Va.

[21] Appl. No.: 95,454

[22] Filed: Nov. 19, 1979

[51] Int. Cl.³ .............................................. H05K 7/20
[52] U.S. Cl. .............................. 361/386; 174/16 HS; 357/81
[58] Field of Search .............................. 361/381–387; 174/16 HS; 357/79, 81

[56] References Cited

U.S. PATENT DOCUMENTS 3,377,524  4/1968  Bock ................................. 174/16 HS
3,626,252  12/1971  Cath ..................................... 361/387

Primary Examiner—Gerald P. Tolin
Attorney, Agent, or Firm—James J. Williams

[57] ABSTRACT

A power transistor, solid state device, or electronic component is mounted on a chassis or heat sink with a thin sheet of insulating material between the transistor and chassis. Machine screws hold the transistor and sheet of insulating material on the chassis, and are insulated by an O ring positioned around each screw and in suitable openings in the chassis. The machine screws press the sheet of insulating material between the transistor and heat sink for good heat transfer, and press each O ring into its respective opening to eliminate air space and improve the voltage breakdown characteristics.

6 Claims, 7 Drawing Figures

MOUNTING ARRANGEMENT FOR TRANSISTORS AND THE LIKE

BACKGROUND OF THE INVENTION

My invention relates to a mounting arrangement for transistors and the like, and particularly to such an arrangement that provides improved voltage insulation and heat transfer characteristics.

Transistors, solid state devices, and electronic components typically operate in a condition that requires good voltage insulation and heat transfer characteristics. Typically, good voltage insulation requires materials that have poor heat transfer characteristics, but good heat transfer requires materials that have poor voltage insulation characteristics.

Accordingly, an object of my invention is to provide a new mounting arrangement for transistors, solid state devices, or electronic components that has improved voltage breakdown and heat transfer characteristics.

A general object of my invention is to provide a new and improved mounting arrangement for transistors and the like.

A relatively specific object of my invention is to provide a new arrangement for mounting a solid state device, such as a power transistor, on a heat sink or chassis with relatively high voltage insulation between the solid state device and the heat sink or chassis, and with relatively good heat transfer between the solid state device and the heat sink or chassis.

Prior art mounting arrangements for transistors and the like have utilized oversized holes and spaces for the mounting screws and hardware to provide voltage insulation. However, such oversized holes and spaces reduce the heat transfer between the device and a heat sink, and may also require silicone grease to prevent voltage breakdown across the air spaces resulting from the oversized holes and spaces. In addition, the prior art mounting arrangements I am familiar with have a breakdown voltage that typically is 1000 volts d.c., or less. In some applications, this is not acceptable.

Accordingly, another object of my invention is to provide a new and improved mounting arrangement for transistors and the like that uses relatively close dimensions for good heat transfer, but that provides relatively high voltage breakdown characteristics without the use of silicone grease and similar insulating materials.

Another and relatively specific object of my invention is to provide an improved transistor or solid state mounting arrangement that has a breakdown voltage that is 3000 volts d.c. or more.

SUMMARY OF THE INVENTION

Briefly, these and other objects are achieved in accordance with my invention by an arrangement for mounting a transistor and the like on a chassis or heat sink with a sheet of insulation between the transistor and heat sink. The transistor is held by one or more screws, each of which passes through an opening in the heat sink and sheet of insulation. In accordance with my invention, resilient and insulating O rings are positioned in respective openings in the heat sink around the screws, and are compressed or squeezed to occupy substantially all of the space in the openings, thus substantially eliminating air spaces. The compressive force of the screws insures good heat transfer between the transistor and heat sink, and at the same time compresses the O rings into their respective openings so as to eliminate air spaces where voltage breakdown would otherwise occur.

BRIEF DESCRIPTION OF THE DRAWING

The subject matter which I regard as my invention is particularly pointed out and distinctly claimed in the claims. The structure and operation of my invention, together with further objects and advantages, may be better understood from the following description given in connection with the accompanying drawing, in which:

DESCRIPTION OF THE PREFERRED EMBODIMENTS

Figure 1:
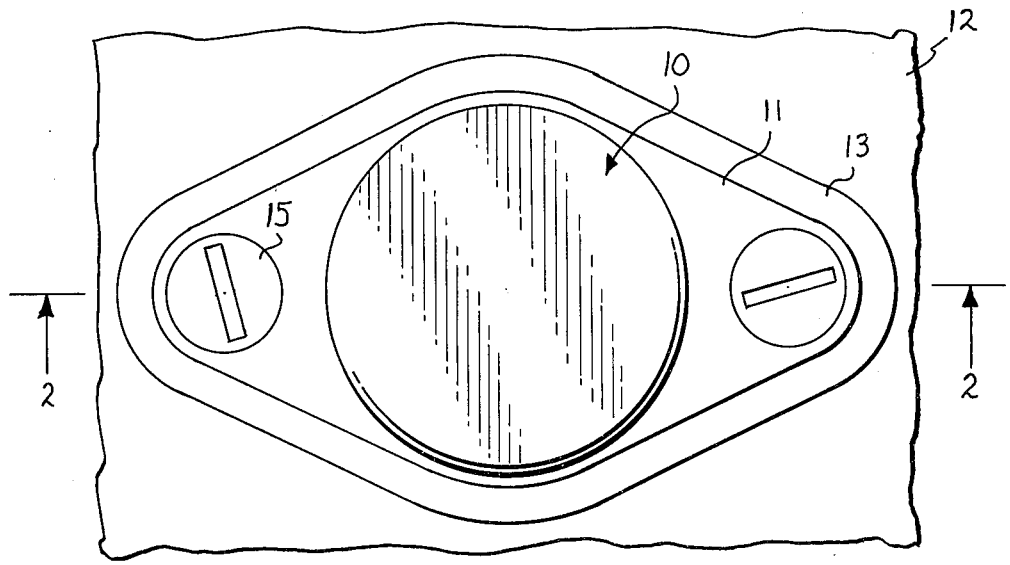
FIG. 1 shows a top plan view of an improved mounting arrangement in accordance with my invention.
Figure 2:
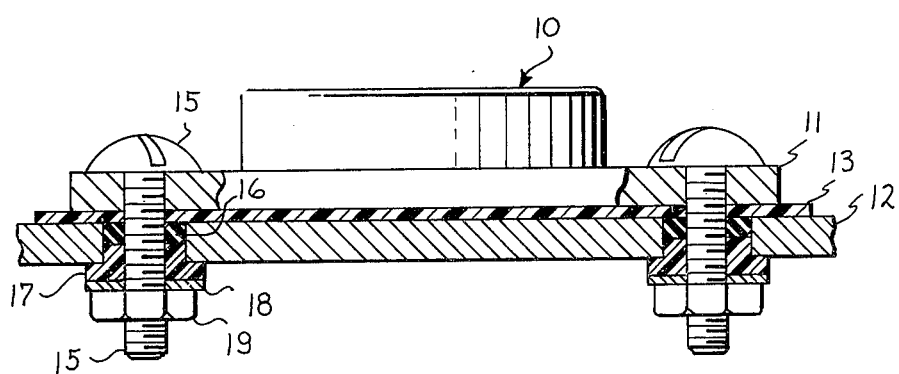
FIG. 2 shows a cross sectional view of my mounting arrangement taken along the lines 2—2 of FIG. 1.

In FIGS. 1 and 2, I have shown a power transistor 10 as an example of my improved mounting arrangement. However, it is to be understood that other solid state devices or electronic components can also be mounted in accordance with my invention. The transistor 10 includes an upper portion and a lower metallic plate or flange 11 which serves as a heat conductor for the transistor. Typically, the plate or flange 11 provides a metallic terminal for one of the electrodes of the transistor 10. The transistor 10 usually has several other electrode terminals (not shown) which would extend below the flange 11 for connection to a circuit. In many applications, this flange or plate 11 must be electrically insulated from a metallic chassis or heat sink 12 on which the transistor 10 is mounted. However, the plate or flange 11 should be arranged so as to provide the best heat transfer possible to the chassis or heat sink 12.

In accordance with my invention, I provide a relatively thin sheet of insulating material 13, such as mica or beryllium oxide on the chassis 12. The thickness of the insulating material 13 should be sufficient to provide the desired voltage breakdown characteristics, but no thicker than necessary so that a good heat transfer can be made between the transistor plate 11 and the chassis or heat sink 12. Typically, a device such as the transistor 10 is provided with a plurality of mounting holes. My mounting arrangement is substantially similar for each of such mounting holes, so I will describe only the left hand portion as viewed in FIG. 2, it being understood that the other portion utilizes the same arrangements and elements.

Figure 3:
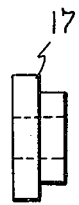
FIGS. 3 and 4 show two views of an insulator plug used in my mounting arrangement of FIGS. 1 and 2.
Figure 4:

A fastening device 15, such as a threaded machine screw, passes through the usual mounting hole in the plate 11 through an opening in the insulating material 13, and through a larger opening in the chassis or heat sink 12. Preferably, the holes and openings are all circular. A circular O ring 16 (or toroid) of suitable resilient and insulating material, such as neoprene or silicone rubber, is positioned around the screw 15 and in this larger opening in the chassis or heat sink 12. The O ring 16 is preferably dimensioned so that its cross sectional area fills up as much of the space existing between the screw 15 and the walls around the larger opening in the chassis 12. A circular plug 17 of suitable insulating material such as teflon is provided. As seen in FIGS. 3 and 4, this plug 17 has a small diameter portion which fits in the opening in the chassis or heat sink 12, and a large diameter portion that provides a shoulder which projects against the lower face of the chassis or heat sink 12. If desired, a circular washer 18 may be placed over the plug 12. A suitable nut 19 is threaded on the machine screw 15.

Figure 5:
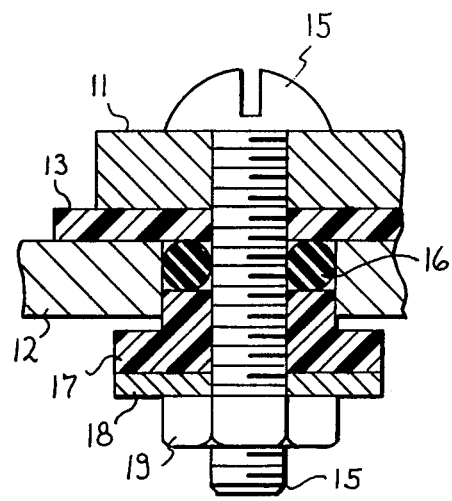
FIGS. 5 and 6 show partial enlarged cross sectional views of my mounting arrangement for explaining its operation.
Figure 6:
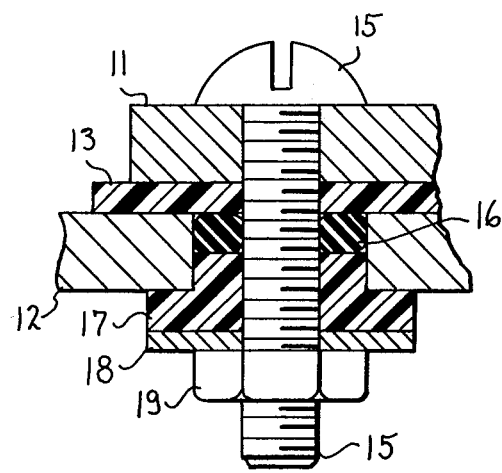

When the parts just described have been assembled for all of the mounting holes in the transistor plate 11, and before the nuts 19 are tightened, they have the relation shown in FIG. 5. In FIG. 5, it will be seen that the O ring 16 occupies most of the space in the heat sink opening around the screw 15. As the nut 19 on each machine screw 15 is tightened, it presses the washer 18 and the plug 17 upward. When this occurs, the O ring 16 is compressed or squeezed between the material 13 and the plug 17 so that its dimensions are changed to substantially fill all of the remaining space in the large opening in the chassis or heat sink 12. This is shown in FIGS. 2 and 6. The O ring 16 and the small portion of the plug 17 are preferably dimensioned so that when the shoulder of the plug 17 engages the chassis 12, the O ring 16 is compressed to fill the space. When this occurs, the air space is reduced considerably or totally eliminated, and the voltage breakdown characteristics between the tranistor plate 11, the screw 15, the washer 18, and the nut 19 on the one hand, and the chassis or heat sink 12 on the other hand are greatly improved (i.e. made greater). Persons skilled in the art will appreciate that the O ring 16 can have various cross sections (such as elliptical) to provide additional material in a vertical direction (or parallel to the axis of the machine screw 15). This additional material will be compressed by the upper portion of the plug 17, and serves to fill up the air spaces in the large opening of the chassis or heat sink 12 more than an O ring of circular cross section. Also, the plug 17 may have no shoulder so that there is no limit on the distance it can be forced into the chassis opening, thus assuring good compression on the O ring 16.

Persons skilled in the art will appreciate that the machine screws 15 also compress the transistor plate or flange 11 tightly against the insulating material 13 and against the chassis or heat sink 12 so as to provide good insulation but at the same time good heat transfer characteristics. Any voltage breakdown from air spaces is reduced considerably because of the compression of the O ring 16 in the large opening. And while I have shown an arrangement with only two machine screws, persons skilled in the art will appreciate that a mounting arrangement with only one machine screw and my associated components or with more than two machine screws and associated components can also be used.

Figure 7:
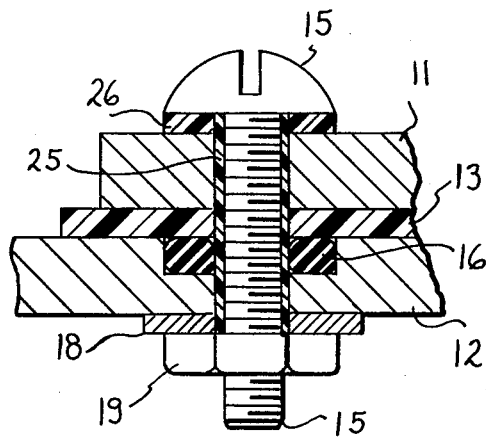
FIG. 7 shows a cross sectional view of a mounting arrangement in accordance with another embodiment of my invention.

FIG. 7 shows a cross sectional view of another mounting arrangement in accordance with my invention. In FIG. 7, parts corresponding to those in FIGS. 1 through 6 have been given the same reference numerals. The major difference between my invention shown in FIG. 7 and that shown in the previous figures is in the opening in the chassis or heat sink 12. This opening includes a large portion or counter bore in the upper part of the chassis or heat sink 12 for receiving the O ring 16, and a relatively small opening through the lower part of the chassis or heat sink 12 for the threaded portion of the machine screw 15. The insulating plug 17 is not used, so that a cylindrical insulating sleeve 25 is provided around a portion of the threads of the machine screw and an insulating washer 26 under the head of the screw 15 to insulate the screw 15 from the transistor plate or flange 11. Otherwise, the arrangement provides the same good compression and heat transfer relation. The O ring 16 is dimensioned so that when it is compressed between the bottom of the counter bore and the insulating material 13, it fills up substantially all of the large space of the counter bore in the chassis 12, and thus reduces the voltage breakdown.

It will thus be seen that I have provided a new and improved mounting arrangement that has substantially improved voltage breakdown (e.g. 3000 volts d.c. or more) and heat transfer characteristics. While I have shown only two embodiments of my invention, persons skilled in the art will appreciate that modifications may be made. As already mentioned, my invention can be used with one, two or more machine screws or fastening devices. Likewise, other devices, such as rivets, can be used in place of the machine screws. And, the O ring may have various cross sectional configurations. Therefore, while may invention has been described with reference to particular embodiments, it is to be understood that modifications may be made without departing from the spirit of the invention or from the scope of the claims.

What I claim as new and desire to secure by Letters Patent of the United States is:

1. An improved arrangement mounting a transistor having a mounting plate on a metallic heat sink having an opening therein, comprising:
   a. an O ring of resilient insulating material positioned in said opening in said heat sink;
   b. a sheet of insulating material positioned on a first surface of said heat sink and against said O ring;
   c. said mounting plate of said transistor being positioned on said sheet of insulating material so that said sheet of insulating material is between said mounting plate and said metallic heat sink;
   d. and means passing through said mounting plate, said sheet of insulating material, said O ring, and said heat sink for compressing said O ring.

2. The improved arrangement of claim 1 wherein said compressing means comprise a metallic member, and insulating means positioned thereon.

3. An improved electronic assembly comprising:
   a. a metallic heat sink having a circular opening therethrough;
   b. a sheet of insulating material positioned on a first surface of said heat sink, said sheet of insulating material having a circular opening therethrough that is aligned with said opening in said heat sink;
   c. a solid state device having a mounting plate positioned on said sheet of insulating material, said mounting plate having a circular opening therethrough that is aligned with said openings in said heat sink and said sheet of insulating material;
   d. a resilient and insulating O ring positioned in said circular opening in said heat sink;
   e. and means passing through said openings and said O ring for causing said O ring to fill up a substantial amount of the space in said heat sink opening.

4. The improved assembly of claim 3 wherein said heat sink opening includes a counter bore in which said O ring is located.

5. The improved assembly of claim 3, and further including an insulating plug positioned in said heat sink opening adjacent said O ring on the side thereof away from said sheet of insulating material.

6. The improved assembly of any one of claims 3, 4 or 5 wherein said means include a threaded member.

* * * * *